(12) United States Patent
Li

(10) Patent No.: US 9,178,085 B2
(45) Date of Patent: Nov. 3, 2015

(54) WAVEGUIDE PHOTODETECTOR AND FORMING METHOD THEREOF

(76) Inventor: Bing Li, Shanghai (CN)

( * ) Notice: Subject to any disclaimer, the term of this patent is extended or adjusted under 35 U.S.C. 154(b) by 239 days.

(21) Appl. No.: 13/996,448

(22) PCT Filed: Dec. 22, 2011

(86) PCT No.: PCT/CN2011/084418
§ 371 (c)(1),
(2), (4) Date: Jun. 20, 2013

(87) PCT Pub. No.: WO2012/083862
PCT Pub. Date: Jun. 28, 2012

(65) Prior Publication Data
US 2013/0285184 A1 Oct. 31, 2013

Related U.S. Application Data

(60) Provisional application No. 61/426,402, filed on Dec. 22, 2010.

(51) Int. Cl.
*H01L 31/0232* (2014.01)
*H01L 31/18* (2006.01)
(Continued)

(52) U.S. Cl.
CPC ........ *H01L 31/02325* (2013.01); *H01L 31/105* (2013.01); *H01L 31/18* (2013.01); *H01L 31/1808* (2013.01); *G02B 6/1228* (2013.01); *Y02E 10/50* (2013.01)

(58) Field of Classification Search
CPC ................... H01L 31/02325; H01L 31/1808; H01L 31/18

USPC ............................................ 257/432; 438/69
See application file for complete search history.

(56) References Cited

U.S. PATENT DOCUMENTS 4,758,531 A 7/1988 Beyer et al.
4,929,302 A 5/1990 Valette
(Continued)

FOREIGN PATENT DOCUMENTS

CN 1411197 4/2003
CN 1512207 7/2004
(Continued)

OTHER PUBLICATIONS

Lui et al., "High-quality single-crystal Ge on insulator by liquid-phase epitaxy on Si substrates", Appl. Phys. Lett. vol. 84, No. 14, 2563, Apr. 5, 2004.
(Continued)

*Primary Examiner* — Mary Wilczewski
*Assistant Examiner* — Damian A Hillman
(74) *Attorney, Agent, or Firm* — Vidas, Arrett & Steinkraus

(57) ABSTRACT

Techniques are described for forming a waveguide photodetector. In one example, a method of forming a waveguide photodetector includes forming a waveguide on a substrate, e.g., silicon on insulator, depositing a first oxide coating over the waveguide and on the SOI substrate, creating a seed window through the first oxide coating to a bulk silicon layer of the SOI substrate, depositing a photodetector material into the seed window and on top of the first oxide coating over the waveguide, depositing a second oxide coating over the photodetector material and over the first oxide coating deposited over the waveguide and on the SOI substrate, and applying thermal energy to liquefy the photodetector material.

13 Claims, 6 Drawing Sheets

(51) Int. Cl.
*H01L 31/105* (2006.01)
*G02B 6/122* (2006.01)

(56) References Cited

U.S. PATENT DOCUMENTS

| | | | |
|---|---|---|---|
| 4,932,032 | A | 6/1990 | Koch et al. |
| 5,078,516 | A | 1/1992 | Kapon et al. |
| 5,220,296 | A | 6/1993 | von Flotow et al. |
| 5,285,514 | A | 2/1994 | Nojiri et al. |
| 5,355,422 | A | 10/1994 | Sullivan et al. |
| 5,814,564 | A | 9/1998 | Yao et al. |
| 5,963,688 | A | 10/1999 | Campi et al. |
| 6,195,481 | B1 | 2/2001 | Nakajima et al. |
| 6,278,820 | B1 | 8/2001 | Hayes |
| 6,434,303 | B1 | 8/2002 | Temkin et al. |
| 6,478,873 | B1 | 11/2002 | Cheong et al. |
| 6,541,355 | B2 | 4/2003 | Joo et al. |
| 6,654,729 | B1 | 11/2003 | Hickman et al. |
| 6,749,893 | B2 | 6/2004 | Ouellet et al. |
| 6,819,839 | B2 | 11/2004 | Zheng et al. |
| 6,825,542 | B2 | 11/2004 | Lam et al. |
| 6,870,152 | B2 | 3/2005 | Ralph et al. |
| 6,956,983 | B2 | 10/2005 | Morse |
| 6,991,892 | B2 | 1/2006 | Block |
| 6,999,670 | B1 | 2/2006 | Gunn, III et al. |
| 7,010,208 | B1 | 3/2006 | Gunn, III et al. |
| 7,016,587 | B2 | 3/2006 | Kubby et al. |
| 7,037,793 | B2 | 5/2006 | Chien et al. |
| 7,049,218 | B2 | 5/2006 | Choi et al. |
| 7,065,272 | B2 | 6/2006 | Taillaert et al. |
| 7,065,273 | B2 | 6/2006 | Bhowmik et al. |
| 7,068,885 | B2 | 6/2006 | Bidnyk et al. |
| 7,088,890 | B2 | 8/2006 | Liu |
| 7,120,350 | B2 | 10/2006 | Block et al. |
| 7,136,544 | B1 | 11/2006 | Gunn, III et al. |
| 7,149,387 | B2 | 12/2006 | Balakrishnan et al. |
| 7,263,244 | B2 | 8/2007 | Tanaka et al. |
| 7,289,698 | B2 | 10/2007 | Deliwala |
| 7,352,926 | B2 | 4/2008 | Spoonhower et al. |
| 7,418,166 | B1 | 8/2008 | Kapur et al. |
| 7,453,132 | B1 | 11/2008 | Gunn, III et al. |
| 7,474,973 | B2 | 1/2009 | Goodwin |
| 7,483,455 | B2 | 1/2009 | Hattori |
| 7,499,620 | B2 | 3/2009 | Patel et al. |
| 7,539,373 | B1 | 5/2009 | Logvin et al. |
| 7,570,365 | B2 | 8/2009 | Trifonov et al. |
| 7,668,416 | B2 | 2/2010 | Li |
| 7,807,523 | B2 | 10/2010 | Liu et al. |
| 7,817,881 | B2 | 10/2010 | Li |
| 7,978,941 | B2 | 7/2011 | Li |
| 7,991,249 | B2 | 8/2011 | Li |
| 8,078,020 | B2 | 12/2011 | Rasras |
| 8,148,265 | B2 | 4/2012 | Carothers et al. |
| 2001/0019644 | A1 | 9/2001 | Nara et al. |
| 2002/0089721 | A1 | 7/2002 | Nicolas |
| 2002/0110309 | A1 | 8/2002 | Devaux et al. |
| 2002/0159684 | A1 | 10/2002 | Sun et al. |
| 2002/0197016 | A1 | 12/2002 | Chandrasekhar et al. |
| 2003/0052082 | A1 | 3/2003 | Khan et al. |
| 2003/0108294 | A1 | 6/2003 | Zheng |
| 2004/0208421 | A1 | 10/2004 | Kitagawa |
| 2005/0053349 | A1 | 3/2005 | Park et al. |
| 2005/0123242 | A1 | 6/2005 | Walker et al. |
| 2006/0008223 | A1 | 1/2006 | Gunn, III et al. |
| 2006/0110113 | A1 | 5/2006 | Park et al. |
| 2006/0165341 | A1 | 7/2006 | Yan et al. |
| 2007/0104411 | A1 | 5/2007 | Ahn et al. |
| 2007/0116398 | A1 | 5/2007 | Pan et al. |
| 2007/0189688 | A1 | 8/2007 | Dehlinger et al. |
| 2007/0230854 | A1 | 10/2007 | Felix Keil |
| 2007/0292073 | A1 | 12/2007 | Li |
| 2008/0002928 | A1 | 1/2008 | Li |
| 2008/0088354 | A1 | 4/2008 | Mosinskis |
| 2009/0003841 | A1 | 1/2009 | Ghidini et al. |
| 2009/0324164 | A1 | 12/2009 | Reshotko et al. |
| 2011/0123153 | A1 | 5/2011 | Nara |
| 2011/0164879 | A1 | 7/2011 | Vasilyev et al. |

FOREIGN PATENT DOCUMENTS

| | | |
|---|---|---|
| CN | 101251559 | 8/2008 |
| CN | 101320111 | 12/2008 |
| EP | 0777139 | 6/1997 |
| JP | 11248949 | 9/1999 |
| JP | 2000131541 | 5/2000 |
| JP | 2009198594 | 9/2009 |

OTHER PUBLICATIONS

Assefa, Solomon et al, CMOS-integrated high-speed MSM germanium waveguide photodetector, Optics Express, Mar. 1, 2010, vol. 18, No. 5, pp. 4986-4999.

Fang, Q. et al, Low Loss (~6.45dB/cm) Sub-Micron Polycrystalline Silicon Waveguide Integrated with Efficient SiON Waveguide Coupler, Optics Express, Apr. 28, 2008, vol. 16, No. 9, pp. 6425-6432.

Beiju et al., "A High-Performance Silicon Electro-Optic Phase Modulator with a Triple MOS Capacitor," Chinese Journal of Semiconductors, vol. 27, No. 12, Dec. 2006, pp. 2089-2093.

Liao et al., "High speed silicon Mach-Zehnder modulator," Optics Express, vol. 13, No. 8, Apr. 18, 2005, pp. 3129-3135.

Liu et al., "Recent advances in high speed silicon optical modulator," Proc. of SPIE vol. 6477, (2007), pp. 1-9.

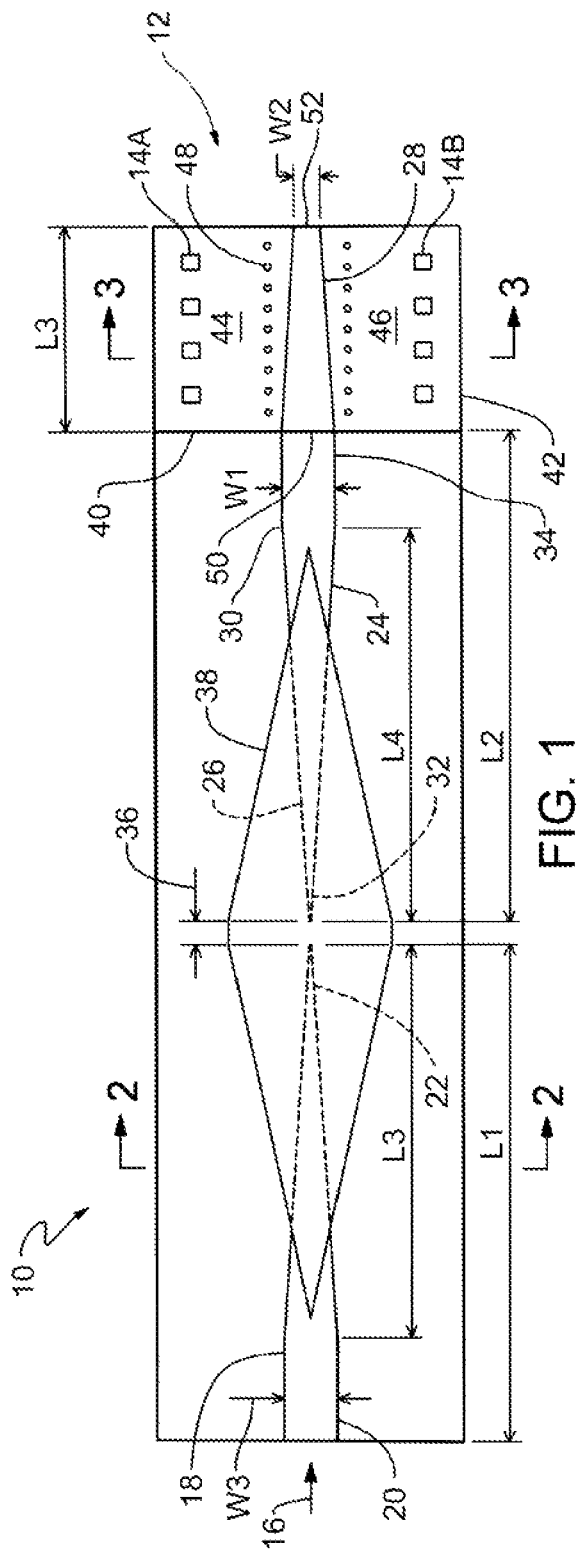

WAVEGUIDE PHOTODETECTOR AND FORMING METHOD THEREOF

This application is a national stage application of PCT Application No. PCT/CN2011/084418, filed on Dec. 22, 2011, which claims the benefit of U.S. Provisional Application No. 61/426,402, entitled "Germanium-loaded silicon waveguide photodetector and the way of making," by Bing Li, and filed on Dec. 22, 2010, the entire content of which is incorporated herein by reference.

TECHNICAL FIELD

The disclosure relates to optoelectronic devices and, more particularly, to waveguide photodetectors that convert optical signals into electrical signals.

BACKGROUND

In optical communication systems, optical waveguides provide a transmission channel for guiding an optical signal produced by a light source, e.g., a laser, at one end of the system to a detector, e.g., a photodetector, at the other end of the system. The photodetector material, an active region, absorbs energy from the photons of the transmitted optical signal, which, in response, excites charge carriers, e.g., electrons and holes. With the application of a reverse bias voltage, the excited charge carriers are attracted to contacts on the photodetector, thereby creating an electrical current that corresponds to the optical signal. In this manner, the photodetector converts an optical signal into an electrical signal.

Many optical communication systems utilize long-wavelength optical signals, e.g., 1310 nanometers (nm). Because silicon does not respond to long-wavelength signals, other materials, e.g., germanium, need to be added to the photodetector. For example, due to its potential for being grown on top of silicon, germanium is an appropriate choice for a photodetector if a monolithically integrated photodetector and silicon-on-insulator ("SOI") photonic device is needed.

The lattice constant refers to the distance between unit cells in a crystal lattice. The lattice constant of the germanium is not perfectly matched with the lattice constant of silicon; the lattice constant of germanium is slightly larger than that of silicon. The mismatch between the lattice constants of germanium and silicon presents problems for using regular epitaxial growth ("EPI") technique for growing crystals. Currently, two main methods have been heavily studied to make single crystal germanium film on top of silicon substrates: 1) using a buffer layer and post-process after selective epitaxial growth ("SEG"), and 2) using the rapid melt growth ("RMG") technique. Between these two methods, RMG has better process compatibility but has a limitation on the structures that can be constructed.

In the buffer layer technique, a thin layer of amorphous germanium is deposited onto the silicon. Although the germanium layer created using the buffer layer technique may be thicker than the layer created using other techniques, the resulting germanium layer has defects because the initial crystal layer was not initially perfect. Defects in the photodetector are undesirable because the defects function as impurities inside the crystal materials that can generate free carriers and cause leakage current even when no light is present. The leakage current may cause noise and false signals.

In the RMG technique, germanium is not grown directly on top of the silicon. Instead, poly-germanium is deposited and then a silicon-dioxide coating is applied that surrounds the poly-germanium. The main issue with using RMG to make a waveguide photodetector stems from the nature of the RMG method itself. The RMG method requires a micro-furnace formed by the silicon-dioxide coating surrounding the deposited poly-germanium. Silicon-dioxide is a low index material, which makes it difficult to couple the light into the resulting high index single crystal germanium. A significant amount of photons are refracted due to the difference in the two indices, resulting in energy not being coupled to the photodetector. The coupling problem can be seen in prior efforts that use the RMG method to integrate germanium with silicon for optical devices, e.g., FIG. 1F in U.S. Pat. No. 7,418,166.

SUMMARY

In general, this disclosure describes a germanium-loaded silicon waveguide photodetector and a method of making such a waveguide photodetector. In particular, this disclosure describes a modified Rapid Melt Growth technique for creating a waveguide photodetector that provides a very small germanium seed coupled directly to a portion of the bulk silicon of a silicon wafer. By providing a very small germanium seed coupled directly to the silicon, fewer defects are created in the germanium after the germanium seed has crystallized, thereby improving the leakage current characteristics of the resulting waveguide photodetector.

In one embodiment, this disclosure is directed to a method of forming a waveguide photodetector. The method comprises forming a waveguide on a substrate, depositing a first oxide coating over the waveguide and on the substrate, creating a seed window through the first oxide coating to a bulk silicon layer of the substrate, depositing a photodetector material into the seed window and on top of the first oxide coating over the waveguide, depositing a second oxide coating over the photodetector material and over the first oxide coating deposited over the waveguide and on the substrate, and applying thermal energy to liquefy the photodetector material. The method further includes cooling the photodetector material to begin crystallization, and then depositing a poly-silicon layer on top of the waveguide.

In another embodiment, this disclosure is directed to a waveguide photodetector comprising a first channel waveguide extending a first length along a substrate and a second channel waveguide extending a second length along the substrate, wherein the second channel waveguide has a first portion, a second portion, a top region, a first side region, and a second side region, and wherein the first channel waveguide and the second channel waveguide are physically separated from one another by a gap. The waveguide photodetector further comprises a waveguide film disposed over a portion of the first channel waveguide, the first portion of second channel waveguide, and the gap. The waveguide photodetector further comprises a photodetector material disposed over the top region, the first side region, and the second side region of the second portion of the second channel waveguide, wherein the photodetector material forms a ridge. The waveguide photodetector further comprises a dielectric film disposed between the second portion of the second channel waveguide and the photodetector material.

In another embodiment, this disclosure is directed to a waveguide photodetector comprising a first channel waveguide extending a first length along a substrate and a second channel waveguide extending a second length along the substrate, wherein the second channel waveguide has a first portion, a second portion, a top region, a first side region, and a second side region, and wherein the first channel waveguide and the second channel waveguide are physically separated from one another by a gap. The waveguide photodetector further comprises a waveguide film disposed over a portion of the first channel waveguide, the first portion of second channel waveguide, and the gap. The waveguide photodetector further comprises a photodetector material that is disposed over the top region but is not adjacent the first side region or the second side region of the second portion of the second channel waveguide, wherein the photodetector material forms a slab. The waveguide photodetector further comprises a dielectric film disposed between the second portion of the second channel waveguide and the photodetector material.

The details of one or more aspects of the disclosure are set forth in the accompanying drawings and the description below. Other features, objects, and advantages will be apparent from the description and drawings, and from the claims.

BRIEF DESCRIPTION OF DRAWINGS

FIG. 1 is a schematic diagram of a top view depicting one example configuration of a waveguide photodetector in accordance with this disclosure.

FIG. 2 is a cross-sectional view taken along line 2-2 of the waveguide photodetector depicted in FIG. 1.

FIG. 3 is a cross-sectional view taken along line 3-3 of the waveguide photodetector depicted in FIG. 1.

FIG. 4 is a cross-sectional view taken along line 3-3 of FIG. 1 of another example waveguide photodetector configuration.

DETAILED DESCRIPTION

Figure 5A:
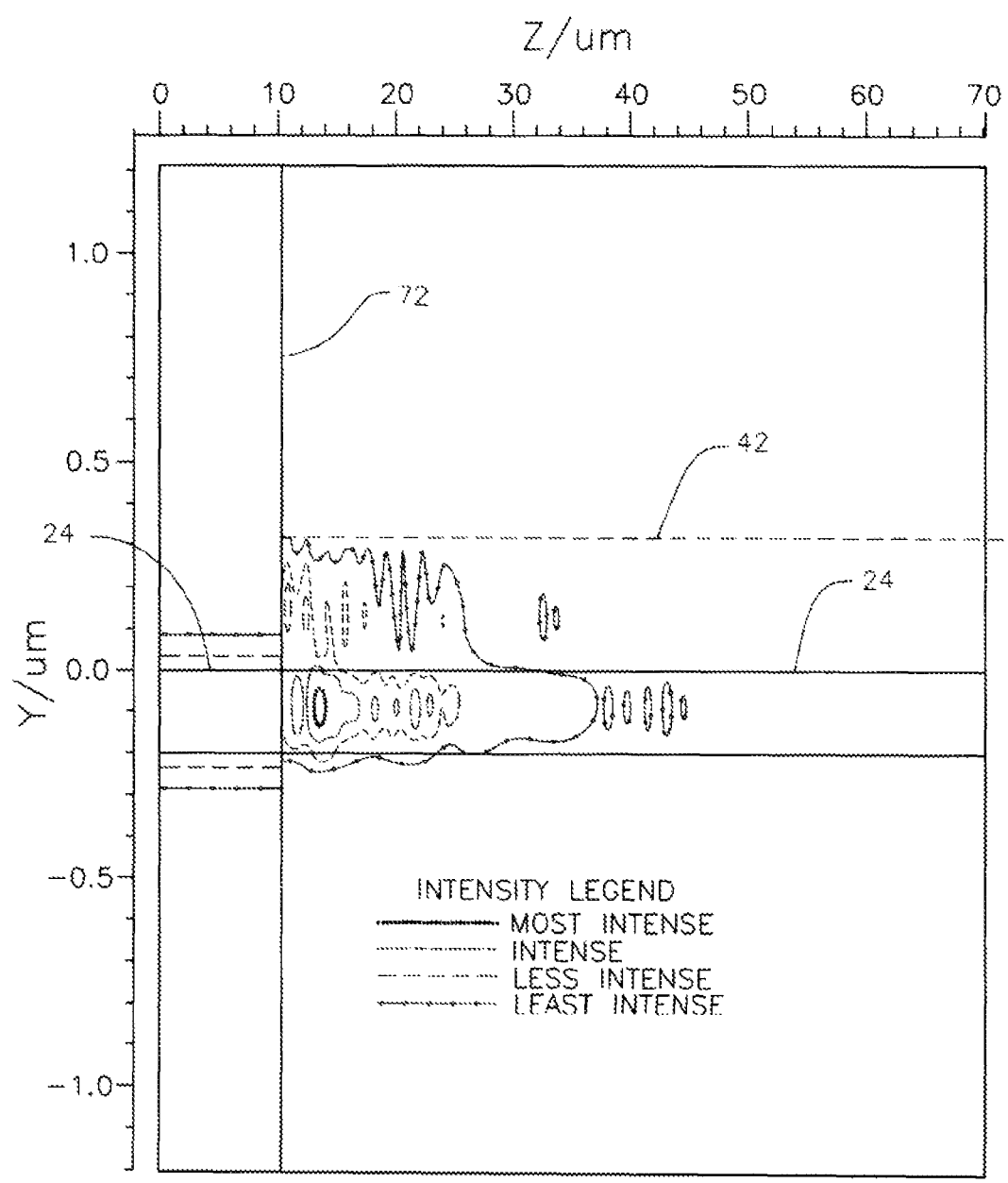
FIGS. 5A-5B are simplified diagrams depicting a wave propagation pattern using the waveguide photodetector depicted in FIG. 3.

This disclosure describes a modified Rapid Melt Growth technique for creating a waveguide photodetector that provides a very small germanium seed coupled directly to a portion of the bulk silicon of a silicon wafer. By providing a very small germanium seed coupled directly to the silicon, fewer defects are created in the germanium after the germanium seed has crystallized, thereby improving the leakage current characteristics of the resulting waveguide photodetector.

FIG. 1 is a schematic diagram of a top view depicting one example configuration of a waveguide photodetector in accordance with this disclosure. The waveguide photodetector, shown generally at 10, provides a transmission channel for guiding an optical signal produced by a light source, e.g., a laser, at one end of an optical communication system (not shown) to a detector, e.g., a photodetector, at the other end of the system. The photodetector, shown generally at 12, and, in particular, the germanium, absorbs photons from the transmitted optical signal, which, in response, excites charge carriers, e.g., electrons and holes. With the application of a reverse bias voltage applied across contacts 14A, 14B, the excited charge carriers are attracted to the contacts on the photodetector, thereby creating an electrical current that corresponds to the optical signal. In this manner, waveguide photodetector 10 converts an optical signal into an electrical signal.

Incoming lightwave 16, e.g., an optical signal, is fed through silicon channel waveguide 18, having length L1, on the left-hand side of waveguide photodetector 10 of FIG. 1. In one example configuration, from left to right in FIG. 1, a portion of first silicon channel waveguide 18 is laterally tapered from first end 20 to second end 22 such that its width W3 is gradually reduced, e.g., to the smallest size allowed in the fabrication process, or almost zero at second end 22. The tapered portion of waveguide 18 has length L3. Another silicon channel waveguide is depicted in FIG. 1, namely second silicon channel waveguide 24 having length L2, includes first portion 26, second portion 28, and third portion 30. In some example configurations, a portion of silicon channel waveguide 24 is laterally tapered from first end 32 to second end 34 such that its width gradually increases from a width of almost zero at first end 32 to a width W1 at second 34. The tapered portion of waveguide 24 has length L4.

In accordance with this disclosure, a gap is created between silicon channel waveguide 18 and silicon channel waveguide 24, namely gap 36. In other words, the two silicon channel waveguides 18, 24 are physically separated by gap 36. In one example, gap 36 is filled by field oxide, e.g., silicon dioxide or other suitable dielectrics. Gap 36 is important to the fabrication process of the waveguide photodetector, which is described in more detail below with respect to FIGS. 7A-7C. Gap 36 helps form the micro-furnace required by the RMG method by sealing the micro-furnace required by the RMG fabrication method. If, instead of including a gap between the silicon channel waveguides using the techniques of this disclosure, the two silicon channel waveguides 18, 24 were connected directly, the micro-furnace required by the RMG method would not be sealed well and silicon channel waveguide 24 would become a cooling path other than that provided by the seed window. The cooling path via silicon channel waveguide 24 creates an unwanted cooling spot that may negatively affect the single crystal formation during the rapid-melting-and-cooling process. By preventing heat from propagating outward via such a cooling path, the techniques of this disclosure improve the single crystal formation, thereby resulting in fewer defects in the germanium material.

Referring still to FIG. 1, because gap 36 exists between channel waveguide 18 and channel waveguide 24, lightwave 16 will not propagate directly between the two waveguides. To bridge gap 36 and allow lightwave 16 to propagate from channel waveguide 18 to channel waveguide 24 (and then to the germanium-encapsulated active region of photodetector 12), waveguide photodetector 10 of FIG. 1 includes poly-silicon film waveguide 38 (also referred to as "waveguide film") deposited on top of a portion of each of silicon channel waveguides 18, 24. Poly-silicon film waveguide 38 is etched to create a pair of lateral tapers with the size-varying direction reversed with respect to the silicon channel waveguide taper underneath. In other words, as the width of channel waveguide 18 decreases, the width of poly-silicon film waveguide 38 increases. Similarly, as the width of channel waveguide 24 increases, the width of poly-silicon film waveguide 38 decreases. Waveguide film 38 is disposed over a portion of first channel waveguide 18, first portion 26 of second channel waveguide 24, and gap 36.

As seen in the example configuration depicted in FIG. 1, waveguide film 38 may be substantially horizontal across gap 36 such that the width of poly-silicon film waveguide 38 remains substantially constant across gap 36. That is, from left to right in FIG. 1, the width of poly-silicon film waveguide 38 may increase until gap 36, remain substantially constant across gap 36, and then the width of poly-silicon film waveguide 38 may decrease after gap 36. Other example configurations are possible, however, and are within the scope of this disclosure.

As the width of silicon channel waveguide 18 decreases, lightwave 16 gradually migrates into poly-silicon film waveguide 38 via adiabatic mode conversion and crosses gap 36. After crossing gap 36, the width of poly-silicon film waveguide 38 decreases and the light from lightwave 16 gradually migrates into silicon channel waveguide 24. Lightwave 16 finally propagates into germanium encapsulated active region 40 of photodetector 12 via silicon channel waveguide 24 and is converted to an electrical signal.

As seen in FIG. 1, silicon channel waveguide 24 continues to extend to the right of poly-silicon film waveguide 38 and under single crystal germanium film 42 deposited using the modified RMG method described in this disclosure. It should be noted that, in accordance with the modified RMG method described in this disclosure, a thin oxide film is deposited between the germanium film and silicon channel waveguide 24, as shown in more detail in FIG. 3. Depositing the thin oxide film prevents the crystallization of germanium from starting from this part of the silicon during fabrication of waveguide photodetector 10. In some example configurations, second channel waveguide 24 further includes third portion 30, and neither waveguide film 38 nor photodetector material 42 is disposed over third portion 30.

Photodetector 12 includes P-type doping region 44, N-type doping region 46, and intrinsic region 48 (defined by the region between the two lines of small circles in FIG. 1), thereby forming a PIN diode. Photodetector 12 further includes one or more contacts 14A and one or more contacts 14B. With the application of a reverse bias voltage applied across contacts 14A, 14B, the excited charge carriers are attracted to the contacts on the photodetector, thereby creating an electrical current that corresponds to the optical signal. In this manner, waveguide photodetector 10 converts an optical signal into an electrical signal.

As seen in FIG. 1, the width of silicon channel waveguide 24 decreases from W1 to W2 underneath germanium film 42. That is, the width of silicon channel waveguide 24 underneath germanium film 42 decreases from first end 50 to second end 52 with the width being greater at the first end than the second end. It should be noted that the width change of silicon channel waveguide 24 from W1 to W2 underneath the germanium film shown in FIG. 1 is optional. Decreasing the width of silicon channel waveguide 24 from W1 to W2 can enhance the leaky mode coupling from silicon to germanium. In some example configurations, however, the width of silicon channel waveguide 24 underneath the germanium film is not changed, i.e. W1=W2.

FIG. 2 is a cross-sectional view taken along line 2-2 of the waveguide photodetector depicted in FIG. 1. In particular, FIG. 2 shows the vertical relationship between silicon channel waveguide 18 and poly-silicon film waveguide 38. Starting at the bottom, FIG. 2 depicts bulk silicon layer 54, buried oxide layer 56, silicon channel waveguide 18 between silicon-dioxide portions 58A, 58B, and poly-silicon film waveguide 38 on top of silicon channel waveguide 18.

FIG. 3 is a cross-sectional view taken along line 3-3 of the waveguide photodetector depicted in FIG. 1. In particular, FIG. 3 depicts the relationship between germanium film 42 and silicon channel waveguide 24. As seen in FIG. 3, germanium film 42 encapsulates silicon channel waveguide 24 (a center silicon rib), and thin oxide film 60 (a thin dielectric film) is disposed between germanium film 42 and silicon channel waveguide 24. That is, dielectric film 60 is disposed between second portion 28 of second channel waveguide 24 and germanium film photodetector material 42. The germanium film photodetector material 42 encapsulates silicon channel waveguide 24 by surrounding three sides of silicon channel waveguide 24. That is, germanium film 42 is disposed over top region 62, first side region 64, and second side region 66. Germanium film 42 forms a ridge, shown generally at 68. The combination of germanium film 42 and encapsulated silicon channel waveguide 24 is referred to in this disclosure as a "dual-stack ridge waveguide," in contrast to the slab-loaded waveguide described below with respect to FIG. 4. At the beginning of the germanium photodetector area, i.e., the leftmost portion of photodetector 12 in FIG. 1, the center silicon rib is at its widest so that its waveguide mode is more confined in silicon. Along the waveguide direction (from left to right), the width of the rib decreases and more light leaks into the germanium film, as shown and described in more detail with respect to FIG. 5. The structure shown in FIG. 3 may also be referred to in this disclosure as a germanium encapsulated silicon waveguide photodetector.

The waveguide photodetector techniques described in this disclosure solve the coupling issues from the silicon channel waveguide to the germanium material that has to be isolated by oxide during the RMG process. Using the techniques of this disclosure, coupling is achieved via leaky mode coupling. That is, the guiding mode in the feed-in silicon channel waveguide 24, which later becomes the center silicon rib encapsulated by the loaded germanium, leaks into the germanium film. As a result of the absorption of the photon energy by the germanium, the coupling occurs continuously from silicon to germanium along the waveguide. It should be noted that the coupling is advantageously wavelength insensitive.

FIG. 4 is a cross-sectional view taken along line 3-3 of FIG. 1 of another example waveguide photodetector configuration. In particular, FIG. 4 depicts the relationship between germanium film 42 and silicon channel waveguide 24. In contrast to the configuration depicted in FIG. 3, germanium film 42 loaded on top of center silicon rib 24 (with a thin oxide coating) has a shape of a slab. Note that germanium film 42 in FIG. 4 does not encapsulate silicon channel waveguide 24, as in FIG. 3, because germanium film 42 is located only above top side 62 of silicon channel waveguide 24. That is, germanium film 42, or photodetector material, is disposed over top region 62 but is not adjacent the first side region or the second side region of second portion 28 of second channel waveguide 24. The combination of the slab of germanium film 42 and silicon channel waveguide 24 is referred to in this disclosure as a "slab-loaded waveguide." The structure shown in FIG. 4 may also be referred to in this disclosure as a germanium slab loaded silicon waveguide photodetector.

The intrinsic region of the structure shown in FIG. 4 (not depicted) may be narrower than the intrinsic region of the structure shown in FIG. 3 because the intrinsic region need only be above the silicon rib of waveguide channel 24. A narrower intrinsic region results in shorter carrier transit times to contacts 14A, 14B. Thus, the configuration shown in FIG. 4 may have faster response times than the structure shown in FIG. 3. In addition, the structure shown in FIG. 4 may be easier to fabricate because of its flat slab feature. For example, during fabrication, it is easier to place contacts on a flat surface. However, the structure shown in FIG. 3 may be more efficient than the structure shown in FIG. 4.

Figure 5B:
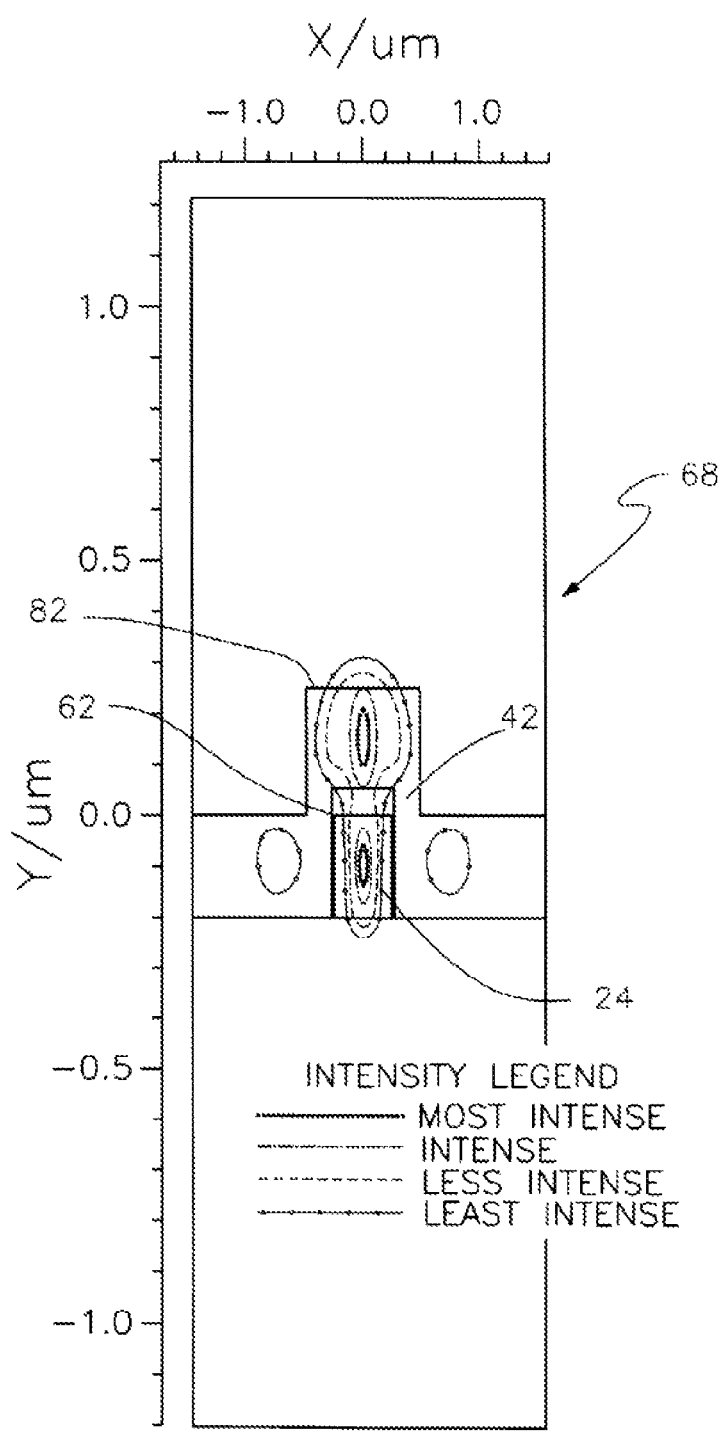

FIGS. 5A-5B are simplified diagrams depicting a wave propagation pattern using the waveguide photodetector depicted in FIG. 3. In particular, FIG. 5A is a simplified diagram depicting a wave propagation pattern, in Y and Z coordinates with units of measure in micrometers, from a side view of the portion of the waveguide photodetector depicted in FIG. 3. Line 72 in FIG. 5A represents the leftmost portion of photodetector 12 in FIG. 1. To the left of line 72, silicon channel waveguide 24 is not encapsulated by germanium and to the right of line 72, silicon channel waveguide 24 is encapsulated by germanium. As seen in FIG. 5A, the energy is mostly confined within silicon channel waveguide 24 to the left of line 72. But, once the light enters into the area in which silicon channel waveguide 24 is encapsulated by germanium, the photon energy starts to couple into the top-side germanium film and as the light propagates, the energy becomes weaker and weaker due to the absorption of the photon energy by the germanium.

FIG. 5B is a simplified diagram depicting one of the wave propagation mode profiles of the germanium encapsulated silicon waveguide (the waveguide photodetector), in X and Y coordinates, from a front view of the portion of the waveguide photodetector depicted in FIG. 3. The black outline 82 corresponds to the outline of germanium and silicon shown and described above with respect to FIG. 3. The mode profile of FIG. 5B shows a large amount of energy inside the germanium.

Figure 6:
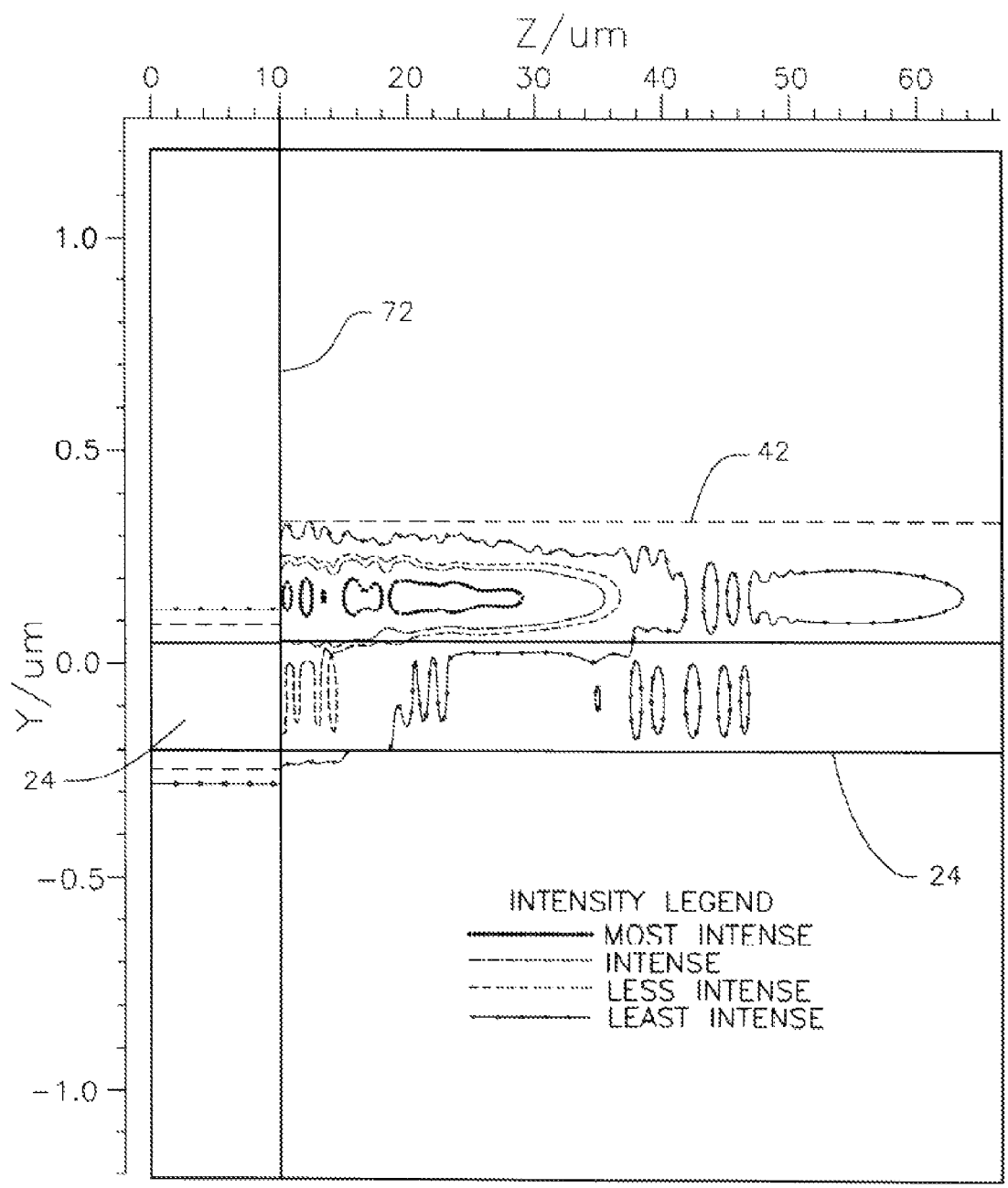
FIG. 6 is a simplified diagram depicting a wave propagation pattern using the waveguide photodetector depicted in FIG. 4.

FIG. 6 is a simplified diagram depicting a wave propagation pattern, in Y and Z coordinates with units of measure in micrometers, from a side view of the portion of the waveguide photodetector depicted in FIG. 4. Line 72 in FIG. 6 represents the leftmost portion of photodetector 12 in FIG. 1. To the left of line 72, silicon channel waveguide 24 is not loaded by germanium and to the right of line 72, silicon channel waveguide 24 is loaded by germanium. As seen in FIG. 6, the energy is confined within silicon channel waveguide 24 to the left of line 72. But, once the light enters into the area in which silicon channel waveguide 24 is loaded by the slab of germanium, the photon energy quickly couples into the top-side slab of germanium film. As the light propagates, the energy quickly becomes weaker due to the absorption of the photon energy by the germanium.

Figure 7A:
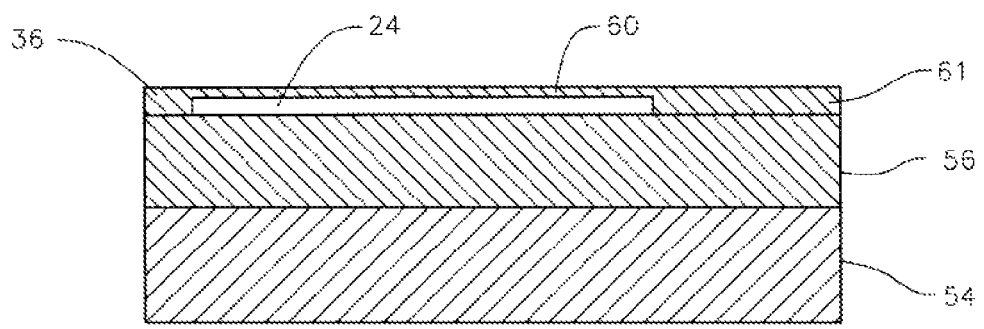
FIGS. 7A-7C depict side views of various structures illustrating an example method of making a waveguide photodetector in accordance with this disclosure.
Figure 7B:
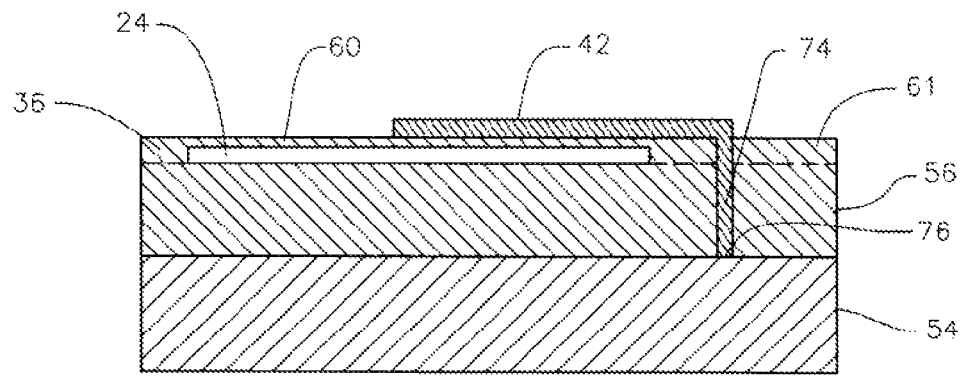
Figure 7C:
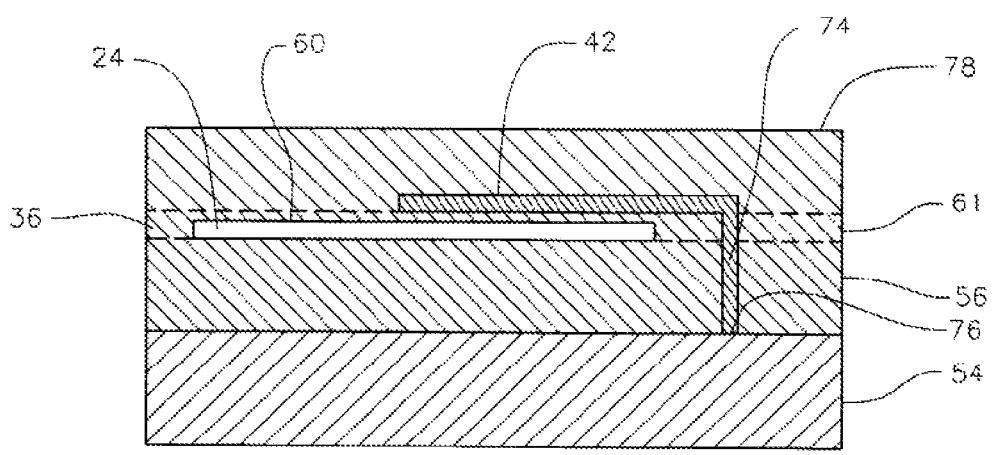

FIGS. 7A-7C depict side views of various structures illustrating an example method of making a waveguide photodetector in accordance with this disclosure. FIG. 7A depicts a side view of a starting substrate structure comprising bulk silicon 54, buried oxide 56 (e.g., silicon dioxide) on top of bulk silicon 54, and silicon channel waveguide 24 on top of buried oxide 56. In other words, silicon channel waveguide 24 is formed on a substrate comprising buried oxide 56 on top of bulk silicon 54. Silicon waveguide 24 is surrounded on the sides by field oxide 61, e.g., silicon dioxide. In addition, the filling of gap 36 is field oxide. Thin oxide coating 60 is deposited over silicon waveguide 24. As indicated above, gap 36 is critical to the fabrication process of the waveguide photodetector. Gap 36 helps form the micro-furnace required by the RMG method by sealing the micro-furnace required by the RMG fabrication method. Without gap 36, heat is allowed to dissipate along the silicon waveguide, which results in the RMG forming a poor single crystal or no single crystal. The techniques of this disclosure improve the single crystal formation, thereby resulting in fewer defects in the germanium material.

FIG. 7B depicts a side view of the starting structure shown in FIG. 7A after the deposition of poly-germanium film 42. First, seed window 74, e.g., a small hole or slot, is created, e.g., via etching or other suitable technique, through field oxide 61 and buried oxide 56. Next, poly-germanium 42 is deposited in seed window 74 and onto thin oxide coating 60 over silicon channel waveguide 24 and a portion of field oxide 61. As seen in FIG. 7B, only a small portion 76 of poly-germanium film 42 is adjacent to bulk silicon 54. Seed window 74 is separated from silicon channel waveguide 24 via a portion of field oxide 61. In some examples, seed window 74 is on the back side and at the end of photodetector 12. Therefore, the seed structure will not affect the operation of the waveguide detector.

FIG. 7C depicts a side view of the structure shown in FIG. 7B after deposition of thick oxide layer 78, e.g., silicon dioxide. Second oxide layer 78 is thicker than the first oxide layer, i.e., field oxide layer 61. As seen in FIG. 7C, with the exception of the small portion 76 of poly-germanium film 42 adjacent to bulk silicon 54, poly-germanium film 42 is completely surrounded by silicon dioxide, thereby forming the micro-furnace required for the RMG method. It should be noted in the existing RMG method, the micro-furnace encloses only the deposited germanium. In the modified RMG method described in this disclosure, however, the micro-furnace formed by the thermal insulating dielectrics encloses not only the deposited germanium but also silicon channel waveguide 24.

The structure shown in FIG. 7C is placed in a furnace at a temperature and thermal energy is applied that liquefies the germanium while keeping the silicon solid. Then, the structure is quickly cooled down, with the outside silicon cooled first. The heat from the liquefied germanium propagates to the outside silicon through seed window 74. The small portion 76 of liquefied germanium 42 adjacent to bulk silicon 54 begins to cool down first. Then, the cooling gradually propagates through the germanium to the portions of the germanium that are located away from portion 76. The germanium adjacent portion 76 becomes the seed for crystallization and the crystals in the germanium grow out from that point. Gap 36 helps form the micro-furnace required by the RMG method by sealing the micro-furnace.

After the modified RMG process described above is complete and the crystallized germanium has formed, a poly-silicon layer is deposited on top of silicon channel waveguides 18, 24, thereby forming poly-silicon film waveguide 38 (FIGS. 1 and 2). Poly-silicon has a large thermal conductivity value. By waiting until after crystal formation to deposit the poly-silicon, an unwanted cooling path is prevented. It should be noted that the method described with respect to FIGS. 7A-7C further includes an implant process to form the P-type, N-type, and intrinsic regions needed by the photodetector.

The implant process may include a Rapid Thermal Annealing (RTA) process. Because the RTA process affects the RMG, implants may be necessary. The thermal process of the RMG (heat than cool) may have to wait and proceed in conjunction with the RTA.

In contrast to the existing RMG and integration processes, the isolated center silicon rib is also encapsulated inside the micro-furnace. The isolated center silicon rib functions as the lightwave feed-in waveguide in the later detecting operation. Due to the fact the silicon rib is thermally isolated by the oxide as a result of the oxide in gap 36, the silicon rib will not affect the temperature gradient required by the RMG process, which requires that the cooling start from the root of the seed window where it is exposed to the bulk silicon of the wafer.

Figure 8:
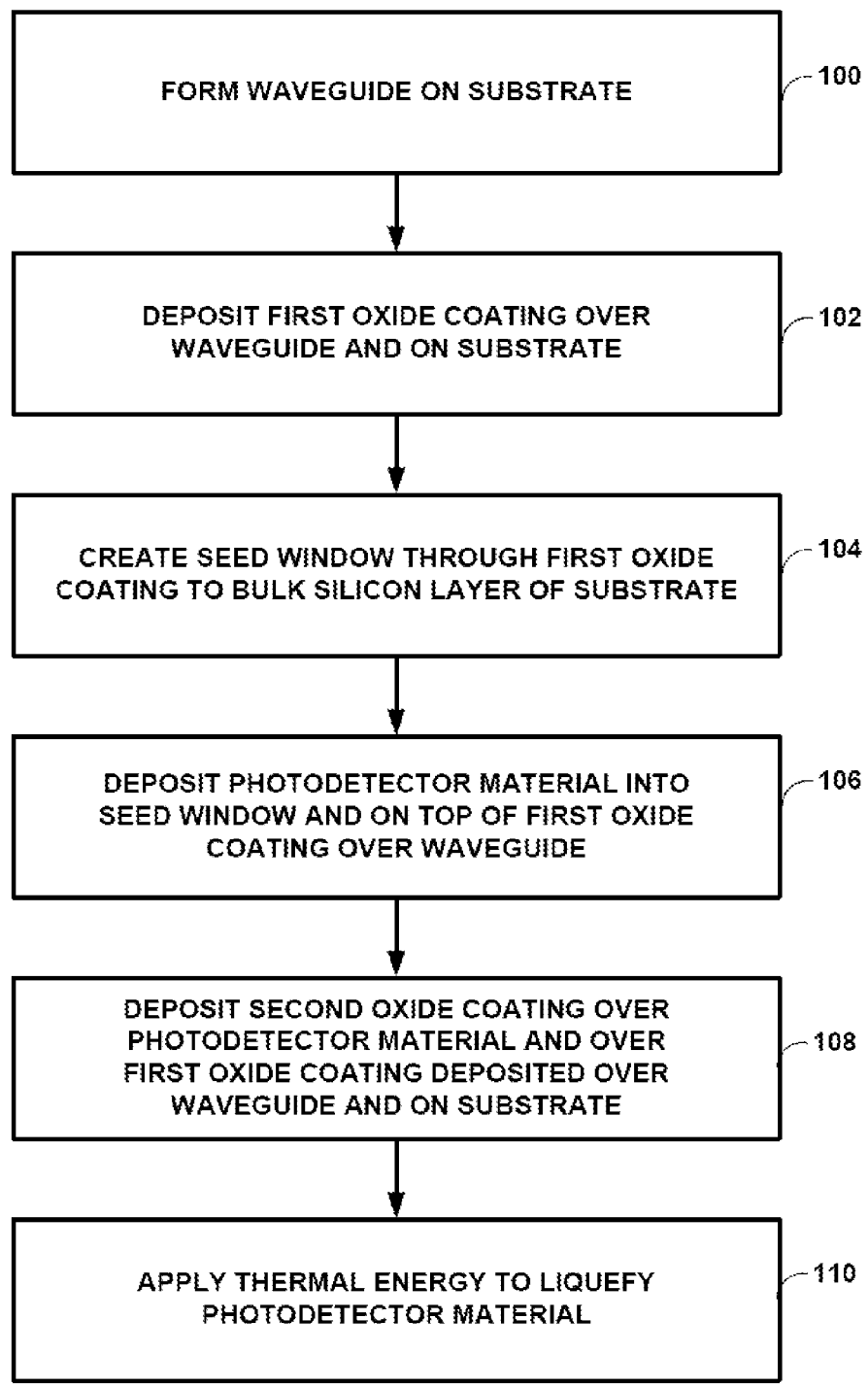
FIG. 8 is a flow diagram illustrating an example method of making a waveguide photodetector in accordance with this disclosure.

FIG. 8 is a flow diagram illustrating an example method of making a waveguide photodetector in accordance with this disclosure. In the example method, a waveguide, e.g., second waveguide 24 of FIG. 1, is formed on a substrate, e.g., a SOI substrate comprising buried oxide 56 on top of bulk silicon 54 of FIG. 7A (100). Next, a first oxide coating, e.g., thin oxide coating 60 of FIG. 7A, is deposited over the waveguide, e.g., waveguide 24, and on the SOI substrate (102). A seed window, e.g., seed window 74 of FIG. 7B, is created through the first oxide coating to the bulk silicon layer of the SOI substrate (104). A photodetector material, e.g., germanium film 42 of FIG. 7B, is deposited into the seed window and on top of the first oxide coating over the waveguide (106). A second oxide coating, e.g., thick oxide layer 78 of FIG. 7C, is deposited over the photodetector material and over the first oxide coating deposited over the waveguide and on the SOI substrate (108). Then, thermal energy is applied to the structure to liquefy the photodetector material (110). As described above with respect to FIG. 7C, the structure is cooled down quickly in order to begin crystallizing the germanium. After the structure is cooled down, a poly-silicon layer is deposited on top of silicon channel waveguides 18, 24, thereby forming poly-silicon film waveguide 38 (FIGS. 1 and 2).

Various aspects of the disclosure have been described. These and other aspects are within the scope of the following claims.

The invention claimed is:

1. A waveguide photodetector comprising:
    a first channel waveguide extending a first length along a substrate;
    a second channel waveguide extending a second length along the substrate,
        wherein the second channel waveguide has a first portion, a second portion, a top region, a first side region, and a second side region, and
        wherein the first channel waveguide and the second channel waveguide are physically separated from one another by a gap;
    a waveguide film disposed over a portion of the first channel waveguide, the first portion of the second channel waveguide, and the gap;
    a photodetector material disposed over the top region, the first side region, and the second side region of the second portion of the second channel waveguide, wherein the photodetector material forms a ridge encapsulating the second channel waveguide; and
    a dielectric film disposed between the second portion of the second channel waveguide and the photodetector material;
    the second silicon channel waveguide completely isolated from the other silicon material of the SOI substrate.

2. The waveguide photodetector of claim 1, wherein the second channel waveguide further comprises a third portion, and wherein neither the waveguide film nor the photodetector material is disposed over the third portion.

3. The waveguide photodetector of claim 2, wherein an optical signal applied to the first channel waveguide propagates into the first portion of the second channel waveguide via the waveguide film and then into the second portion of the second channel waveguide, whereby the optical signal is converted to an electrical signal.

4. The waveguide photodetector of claim 1, wherein the first channel waveguide has a first end, a second end, and a width, and wherein the width of the first channel waveguide is greater at the first end than at the second end.

5. The waveguide photodetector of claim 4, wherein the second channel waveguide has a first end, a second end, and a width, and wherein the width of the second channel waveguide is greater at the second end than at the first end.

6. The waveguide photodetector of claim 5,
    wherein the waveguide film has a first end, a middle region that is disposed over the gap, a second end, and a width,
    wherein the width of the waveguide film is greatest at the middle region,
    wherein the width increases from the first end to the middle region, and
    wherein the width decreases from the middle region to the second end.

7. A waveguide photodetector comprising:
    a first channel waveguide extending a first length along a substrate;
    a second channel waveguide extending a second length along the substrate,
        wherein the second channel waveguide has a first portion, a second portion, a top region, a first side region, and a second side region, and
        wherein the first channel waveguide and the second channel waveguide are physically separated from one another by a gap;
    a waveguide film disposed over a portion of the first channel waveguide, the first portion of second channel waveguide, and the gap;
    a photodetector material that is disposed over the top region but is not adjacent the first side region or the second side region of the second portion of the second channel waveguide, wherein the photodetector material forms a slab loaded over the second channel waveguide; and
    a dielectric film disposed between the second portion of the second channel waveguide and the photodetector material;
    the second silicon channel waveguide completely isolated from the other silicon material of the SOI substrate.

8. The waveguide photodetector of claim 7, wherein the second channel waveguide further comprises a third portion, and wherein neither the waveguide film nor the photodetector material is disposed over the third portion.

9. The waveguide photodetector of claim 8, wherein an optical signal applied to the first channel waveguide propagates into the first portion of the second channel waveguide via the waveguide film and then into the second portion of the second channel waveguide, whereby the optical signal is converted to an electrical signal.

10. The waveguide photodetector of claim 7, wherein the first channel waveguide has a first end, a second end, and a width, and wherein the width of the first channel waveguide is greater at the first end than at the second end.

11. The waveguide photodetector of claim 10, wherein the second channel waveguide has a first end, a second end, and a width, and wherein the width of the second channel waveguide is greater at the second end than at the first end.

12. The waveguide photodetector of claim 11,
    wherein the waveguide film has a first end, a middle region that is disposed over the gap, a second end, and a width,
    wherein the width of the waveguide film is greatest at the middle region,
    wherein the width increases from the first end to the middle region, and
    wherein the width decreases from the middle region to the second end.

13. The waveguide photodetector of claim 11, wherein the photodetector material is deposited in a seed window at the end of the waveguide photodetector so as to not affect the operation of the waveguide photodetector.

* * * * *